United States Patent

Hosokawa et al.

[11] Patent Number: 5,332,555
[45] Date of Patent: Jul. 26, 1994

[54] OZONE BEAM GENERATION APPARATUS AND METHOD FOR GENERATING AN OZONE BEAM

[75] Inventors: Shunsuke Hosokawa, Tsukuba; Masakuni Kawada, Ushiku; Shingo Ichimura, Tsukuba; Hiroshi Murakami, Ushiku, all of Japan

[73] Assignee: Agency of Industrial Science & Technology, Tokyo, Japan

[21] Appl. No.: 733,327

[22] Filed: Jul. 22, 1991

[30] Foreign Application Priority Data

Jul. 27, 1990 [JP] Japan .................................. 200612

[51] Int. Cl.$^5$ ............................................. C23C 14/02
[52] U.S. Cl. ........................... 422/186.05; 422/186.08; 422/186.11; 422/186.12; 204/176; 204/298.07
[58] Field of Search ...................... 422/186.05, 186.08, 422/186.1, 186.11, 186.12, 186.23, 186.24, 186.25; 204/176, 298.07

[56] References Cited

U.S. PATENT DOCUMENTS 5,134,965  8/1992  Tokuga et al. ..................... 118/723
5,228,968  7/1993  Zpjoa ............................. 204/298.07

FOREIGN PATENT DOCUMENTS 262627   5/1987  Japan .
100402  10/1989  Japan .

*Primary Examiner*—Donald P. Walsh
*Assistant Examiner*—Daniel Jenkins
*Attorney, Agent, or Firm*—Spencer, Frank & Schneider

[57] ABSTRACT

An ozone beam generation apparatus includes an ozonizer for forming an ozone-containing gas through the ozonization of an oxygen-containing gas; a refrigerator for liquefying or solidifying only ozone present in the ozone-containing gas; a vessel for storing the liquefied or solidified ozone; a temperature controller for contorting the temperature of the storing vessel and for gasifying the liquefied or solidified ozone; and a piping system for transporting-the gasified ozone to a desired device. The apparatus makes it possible to steadily and safely supply pure ozone to an apparatus for oxidation treatment.

11 Claims, 3 Drawing Sheets

OZONE BEAM GENERATION APPARATUS AND METHOD FOR GENERATING AN OZONE BEAM

BACKGROUND OF THE INVENTION

1. Field of the Invention

The present invention relates to an ozone beam generation apparatus and a method for generating an ozone beam and particularly to an apparatus and a method which permits the precise and steady supply of pure ozone as a strong oxidizing agent during oxidation processes performed under vacuum, such as the formation of high temperature-superconductive thin films, silicon oxide films, and insulating films in the production of semiconductor devices.

2. Description of the Prior Art

An oxidation treatment under vacuum has been performed according to a variety of techniques such as plasma processing, high temperature treatment in an oxygen atmosphere, a method in which active oxygen is supplied by an ion gun, or a method in which an ozonizer is directly connected to a processing apparatus to introduce ozonized oxygen into the processing apparatus. However, these methods suffer from various problems such as insufficient oxidizing capacity, formation of defects in the treated substances during high temperature treatments and physical sputtering processes, and formation of non-uniform products.

FIG. 1 shows an embodiment of the conventional ozone beam generation apparatus. This is an apparatus for supplying ozone to a processing chamber 1 in which a sample 2 is oxidized. An ozone-containing gas generated in an ozonizer 6 is fed to an ozone chamber 5 of quartz glass accommodated in a liquid nitrogen reservoir 4 through a valve 7, and the chamber 5 is evacuated by an operating vacuum pump 3 to establish a low pressure within the chamber. The pressure in the chamber 5 is measured with a vacuum gauge 8. To thereby liquefy only ozone present within chamber 5, valves 7 and 12 are closed at a time when a desired amount of ozone is liquefied. Then a valve 13, positioned between the ozone chamber 5 and the chamber, 1 which has been previously evacuated by a vacuum pump 15, is opened followed by the operation of a temperature control device 9 and the heating of the ozone chamber 5 by a heater 10 in order to gasify the liquefied ozone. The temperature of the ozone chamber 5 is determined by a thermo-couple 11 and is held at a predetermined level by the temperature control device. The gasified ozone is supplied to the sample 2 through a pipe 14. In such a conventional ozone beam generation apparatus in which liquid nitrogen is employed, it is impossible to precisely perform temperature control, which in turn leads to difficult control of the ozone dose, contamination of ozone with oxygen during liquefaction thereof and a high possibility of explosion.

To precisely control the ozone dose and to eliminate the possibility of explosion, the following problems must be solved:

(1) Liquefaction or solidification of pure ozone: It is necessary to steadily liquefy or solidify only ozone in the gas supplied from an ozonizer and simultaneously prevent the contamination thereof with impurities which can exert catalytic action on the ozone.

(2) Precise control of the saturated vapor pressure of ozone: The saturated vapor pressure of ozone is a function of temperature and, therefore, the temperature of ozone must precisely be controlled within an accuracy of 0.1K in order to precisely control the dose of ozone.

(3) Safety measures against ozone explosion: Ozone is an unstable substance. For this reason, it must not only be handled within a low temperature and pressure atmosphere, but also be kept away from contamination with impurities which may trigger explosion, and irradiation with ultraviolet rays as much as possible. Moreover, the materials for containers which come in contact with pure ozone gas, liquified ozone or solidified ozone must be those which do not serve as a catalyst for ozone. In addition, safety measures must be taken so that human bodies and the apparatuses can certainly be protected against damages even if explosion accidentally takes place.

SUMMARY OF THE INVENTION

Accordingly, an object of the present invention is to provide an ozone beam generation apparatus which can solve the foregoing problems, ensure precise control of the ozone dose and eliminate the possibility of explosion.

Another object of the present invention is to provide a method for generating an ozone beam, which permits precise and steady supply of pure ozone as a strong oxidizing agent during oxidation processes performed under vacuum.

According to the first aspect of the present invention, there is provided an ozone beam generation apparatus which comprises ozonizing means for forming an ozone-containing gas through the ozonization of an oxygen-containing gas;

refrigerating means for liquefying or solidifying only ozone present in the ozone-containing gas;

means for storing the liquified or soidified ozone;

means for controlling the temperature of the storing means and for gasifying the liquefied or solidified ozone; and a piping system for transporting the gasified ozone to a desired device.

Here, it may further comprise means for removing fine particulate substances positioned between the ozonizing means and the storing means, means for evacuating the storing means, and means for oxidizing ozone disposed in an exhaust path of the evacuation means.

The storing means may be a container made of a metal which does not serve as a catalyst for ozone.

The metal which does not serve as a catalyst for ozone may be stainless steel.

An inner wall of the container may be electrolytically polished.

An ozone path connecting the storing means to the desired device may be made of a metal which does not serve as a catalyst for ozone and the inner surface of the path may be electrolytically polished.

The storing means may be provided with a safety fracture valve to be fractured when the pressure of the storing means goes beyond a predetermined pressure.

According to the second aspect of the present invention, there is provided a method for generating an ozone beam which comprises steps of:

ozonizing an oxygen-containing gas to form an ozone-containing gas;

refrigerating the ozone-containing gas to liquefy or solidify only ozone present therein;

storing the liquefied or solidified ozone;

controlling the temperature of the stored ozone and for gasifying the liquefied or solidified ozone; and transporting the gasified ozone to a desired device.

In the present invention, the liquefaction and/or solidification as well as gasification of ozone are carried out by a temperature control system which comprises a refrigerator and a heater The chamber in which the liquefaction and/or solidification as well as gasification of ozone are performed is made of a metal which does not exert catalytic action on ozone. Precise control of temperature can be attained within an accuracy of the order of 0.1K, the control thereof being preformed stably and in high setting precision. Such precise control of ozone temperature makes it possible to prevent a local and abrupt temperature change during the liquefaction, solidification and gasification thereof and correspondingly the explosion of ozone due to heat can certainly be prevented. Pure ozone can be quite stably supplied to an oxidizing chamber without causing any pressure fluctuation through such precise temperature control.

In addition, the ozone beam generation apparatus of the present invention comprises a high quality filter which is disposed in the ozone path between an ozone chamber and the ozonizer, i.e., on the side of the ozonizer to thus prevent the contamination of the contents of the chamber, in which the liquefaction, solidification and gasification are performed, with impurities which exert catalytic action on ozone and are possibly carried over from the ozonizer and/or a vacuum pump. Moreover, a high quality trap is positioned at a portion upstream of the pump for preventing the contamination of ozone with, in particular, carbonaceous materials carried over through the vacuum pump. An ozone killer is positioned on the chamber side of the trap so that the vacuum pump system is not adversely affected by the excess ozone present.

Further, as a measure against the unexpected explosion of ozone, a safety fracture valve is disposed in the ozone chamber so that human bodies and various devices can certainly be protected against damages. Thus, breakage of the ozone beam generation apparatus can be prevented before it happens due to the presence of the safety fracture valve. Furthermore, if the safety fracture valve is directly connected to an exhaust duct, the leakage of high concentrations of ozone into the working atmosphere due to an unexpected explosion of the ozone can be prevented.

Where ozone having strong oxidizing ability is used in processes which comprise an oxidation treatment, such as formation of a thin film, formation of fine particles, and etching processes the present invention permits sufficient oxidation of a subject even in a low temperature and high vacuum condition. In contrast, the conventional ozone handling techniques do not provide stable and safe ozone supply at all.

According to the apparatus and method of the present invention, well-controlled ozone can safely be supplied to an ozone chamber through simple operations.

The above and other objects, effects, features and advantages of the present invention will become more apparent from the following description of embodiments thereof taken in conjunction with the accompanying drawings.

DETAILED DESCRIPTION OF PREFERRED EMBODIMENTS

An embodiment of the present invention will hereinafter be described in more detail with reference to the attached drawings.

Figure 1:
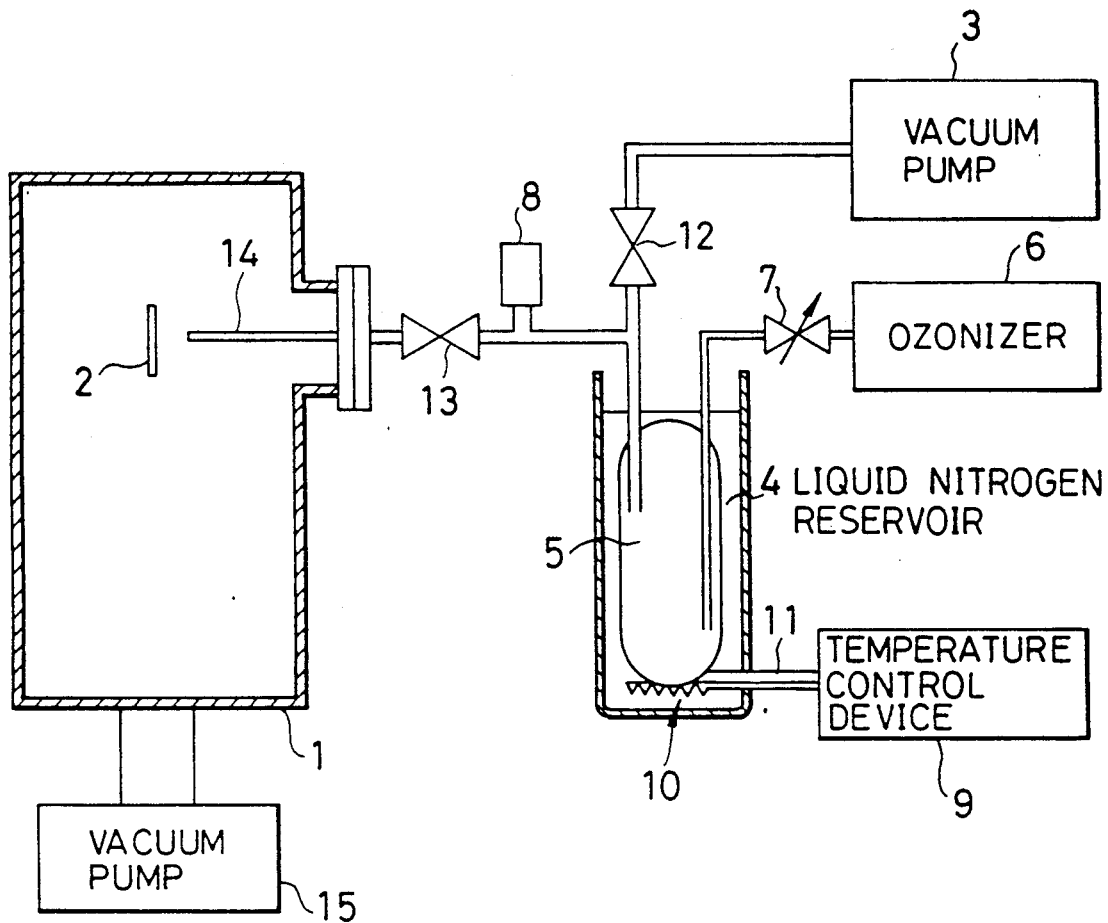
FIG. 1 is a schematic view illustrating the structure of a conventional ozone generation apparatus.
Figure 2:
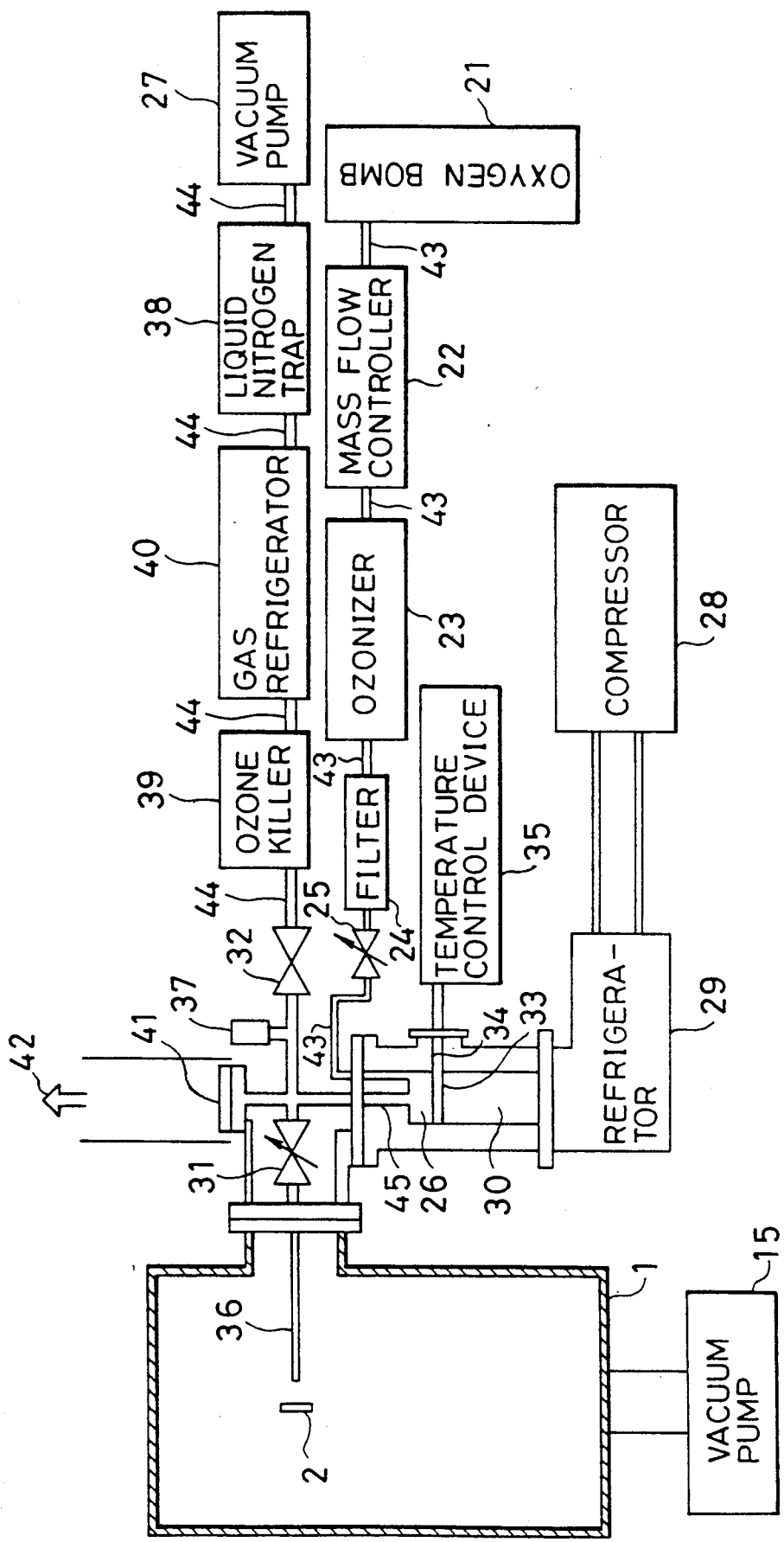
FIG. 2 is a schematic view illustrating the structure of an embodiment of the ozone-generation apparatus according to the present invention.

FIG. 2 shows an embodiment of the apparatus of the present invention which is connected to a chamber for oxidation treatment.

Oxygen contained in an oxygen bomb 21 is fed to an ozonizer 23 through a mass flow controller 22 to form an ozone-containing gas. There may be used, for instance, known ozonizers which make use of silent electric discharge such as an ozone tube available from Siemens-Halske or ozonizers manufactured and sold by Abraham-Marmier. In these ozonizers, the conversion of oxygen into ozone is about 5%. It is also possible to use an ozonizer which generates ozone through the electrolysis of the oxygen-containing gas.

The resulting ozone-containing gas is introduced into an ozone chamber 26 through a commonly used filter 24 for removing fine particulate substances and a valve 25 for controlling the flow rate thereof. The ozone-containing gas is introduced into the ozone chamber 26 at a predetermined flow rate while the pressure thereof is maintained at a desired level by the action of the mass flow controller 22, the flow rate controlling valve 25 and a vacuum pump 27. In this respect, the oxygen bomb 21, the mass flow controller 22, the ozonizer 23, the filter 24 and the ozone chamber 26 are, in this order, connected through a proper piping system 43. The ozone chamber 26 thermally comes in contact with a cold head 30 of a refrigerator 29, which is operated by a compressor 28, and is maintained at a low temperature in the order of 75 to 95K. The ozone chamber 26 is made from a metal free of catalytic action against ozone such as stainless steel and the inside walls of the ozone chamber 26 are preferably electrolytically polished. The inner volume of the ozone chamber 26 is, for example, about 5 cm$^3$ and the surface area of the cold head 30 is, for example, about 10 cm$^2$. In the ozone chamber only ozone is liquefied under the conditions of a temperature ranging from 75 to 95K and a pressure of not more than 10 Torr while making use of the difference between the saturated vapor pressures of the components present in the ozone-containing gas. The remaining gas, mainly comprising oxygen, is exhausted by the action of the vacuum pump 27 through a valve 32, an ozone killer 39, a gas refrigerator 40 and a liquid nitrogen trap 38, these devices and/or tools being, in order, connected through a proper piping system 44. At this stage, a conductance valve 31 positioned between the ozone chamber 26 and the oxidation treatment chamber 1 is closed, while the valves 25 and 32 are opened. The ozone-containing gas supplied from the ozonizer is cleaned by passing it through the filter 24 for removing fine particulate substances, for instance, an in-line gas filter which can remove 99.9999% of fine particles having a particle size of not less than 0.05 μm. After liquefying a predetermined amount of ozone, the valves 25 and 32 are closed while the valve 31 is opened to thus communicate the ozone chamber 26 to the chamber 1 for oxidation treatment. The temperature of the liquefied ozone is controlled to a level ranging from about 80 to 100K within an accuracy of 0.1K by a temperature control device 35 which is equipped with the refrigerator 29, a heater 33 and a resistance thermometer 34 to establish a predetermined saturated vapor pressure of ozone and thus pure ozone is introduced into chamber 1 for oxidation treatment through a pipe 36.

Figure 3:
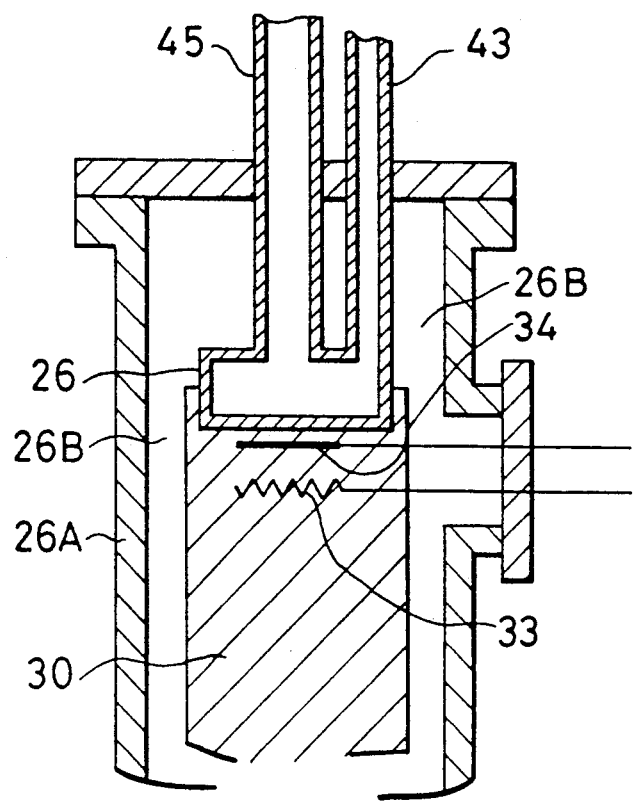
FIG. 3 is an enlarged sectional view of an ozone chamber according to the present invention.

FIG. 3 shows an enlarged sectional view of the ozone chamber. The ozone chamber 26 and the cold head 30 are enclosed within a cylinder 26A and the space 26B between the cylinder 26A and the ozone chamber 26, cold head 30 is evacuated for thermal insulation. The ozone chamber 26 is thermally connected to the cold head 30 so that the former is cooled with the latter. Preferably, the path from the ozone chamber 26 to the treatment chamber 1 comprises a pipe 45 and a valve 31 made of stainless steel and having inner, electropolished walls. Stainless steel does not have a catalytic function against ozone, so that the lifetime of ozone can be elongated due to the usage of the electropolished stainless steel. The heater 33 and the resistance thermometer 34 are embedded in the top portion of the cold head 30 and are connected to the temperature control device 35. The pressure is determined by a vacuum gauge 37. Thus, the pressure could be controlled within a fluctuation ranging from 1 to 2% by controlling the temperature of ozone within an accuracy of 0.1K. The ozone dose is controlled by adjusting the conductance between chamber 1 for oxidation treatment and the ozone chamber 26 by the use of the valve 31. In this example the maximum ozone dose is about $10^{17}$ molecules per second which depends on the conductance of the valve 31 and the pipe 36. In chamber 1 for oxidation treatment, ozone generated in the ozone chamber is transported to the vicinity of the sample 2 (or substrate) through the pipe 36 to thereby increase the effective ozone dose while keeping the pressure increase as low as possible.

To prevent mixing of contaminants, in particular, carbonaceous materials originating from the vacuum pump 27 with ozone present in the ozone chamber 26, the liquid nitrogen trap 38 is positioned between the vacuum pump 27 and the chamber 26 for liquefying and gasifying ozone. In addition, the ozone killer 39 is disposed for the purpose of preventing the exhaustion of ozone outside the system. The ozone killer 39 is a pipe of stainless steel and serves to convert ozone into oxygen by heating it at a temperature of about 400° C. The heated oxygen is passed though the gas refrigerator 40 and exhausted by the action of the vacuum pump 27.

Further, a fracture valve 41 is positioned above the ozone chamber 26 as a measure against accidental occurrence of explosion. This valve 41 is connected to a draft 42 and fractured when the pressure of the ozone chamber exceeds the predetermined pressure, therefore, human bodies and machinery and tools are protected from damages.

As has been discussed above in detail, the present invention makes it possible to steadily and safely supply pure ozone to an apparatus for oxidation treatment. This has not been achieved by the conventional methods.

The present invention has been described in detail with respect to preferred embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. An ozone beam generation apparatus comprising;
   ozonizing means for forming an ozone-containing gas through the ozonization of an oxygen-containing gas;
   storing means for liquefying or solidifying ozone in said ozone-containing gas, storing the liquified or solidified ozone, and gasifying said liquified or solidified ozone;
   refrigerating means having a cold head in thermal contact with said storing means for liquefying or solidifying only ozone present in said ozone-containing gas while leaving gas other than ozone contained within said ozone containing gas in a gaseous state and further for gasifying said liquified or solidified ozone;
   means for controlling the temperature of said storing means via said cold head for liquefying ozone in said storing means and for gasifying the liquefied or solidified ozone;
   means for evacuating said gas other than ozone from said storing means; and
   a piping system for transporting the gasified ozone to a desired device.

2. A ozone beam generation apparatus as claimed in claim 1, further comprising means for removing fine particulate substances positioned between the ozonizing means and the storing means, and means for oxidizing ozone disposed in an exhaust path of said evacuation means.

3. A ozone beam generation apparatus as claimed in claim 1, wherein the storing means is a container comprising a metal which does not serve as a catalyst for ozone.

4. A ozone beam generation apparatus as claimed in claim 3, wherein said metal which does not serve as a catalyst for ozone in stainless steel.

5. A ozone beam generation apparatus as claimed in claim 4, wherein an inner wall of said container is electrolytically polished.

6. A ozone beam generation apparatus as claimed in claim 1, wherein an ozone path connecting said storing means to said desired device comprises a metal which does not serve as a catalyst for ozone, and wherein an inner surface of said path is electrolytically polished.

7. A ozone beam generation apparatus as claimed in claim 1, wherein said storing means is provided with a safety tracture valve to be fractured when a pressure of said storing means exceeds a predetermined pressure.

8. A method for generating an ozone beam comprising the steps of;
   ozonizing an oxygen-containing gas to form an ozone-containing gas;
   refrigerating said ozone-containing gas to liquefy or solidify only ozone present in said ozone-containing gas while leaving gas other than ozone in a gaseous state in an ozone chamber;
   evacuating said gas other than ozone from said ozone chamber to store said liquified or solidified ozone;
   controlling the temperature of said stored ozone to gasify the liquefied or solidified ozone; and
   transporting the gasified ozone to a desired device.

9. An ozone beam generation apparatus as claimed in claim 1 further comprising a heater and a temperature detection sensor embedded in said cold head.

10. An ozone beam generation apparatus as claimed in claim 1, further comprising means for varying the conductance of said piping system.

11. An ozone beam generation apparatus as claimed in claim 1 further comprising means for changing a first flow path of the ozone or said gas other than ozone from said storing means to said desired device, to a second flow path from said storing means to an evacuation system.

* * * * *